(12) United States Patent
Navarro

(10) Patent No.: US 11,707,001 B2
(45) Date of Patent: Jul. 18, 2023

(54) PHASE-CHANGE RESISTIVE MEMORY

(71) Applicant: COMMISSARIAT À L'ÉNERGIE ATOMIQUE ET AUX ÉNERGIES ALTERNATIVES, Paris (FR)

(72) Inventor: Gabriele Navarro, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 43 days.

(21) Appl. No.: 16/773,226

(22) Filed: Jan. 27, 2020

(65) Prior Publication Data
US 2020/0243766 A1 Jul. 30, 2020

(30) Foreign Application Priority Data

Jan. 28, 2019 (FR) ...................................... 1900749

(51) Int. Cl.
H10B 63/00 (2023.01)
H10N 70/20 (2023.01)
H10N 70/00 (2023.01)

(52) U.S. Cl.
CPC ........... *H10N 70/026* (2023.02); *H10B 63/00* (2023.02); *H10B 63/24* (2023.02); *H10N 70/231* (2023.02); *H10N 70/841* (2023.02); *H10N 70/8828* (2023.02)

(58) Field of Classification Search
CPC ..... H01L 27/24; H01L 27/2427; H01L 45/06; H01L 45/1233; H01L 45/1253; H01L 45/144; H01L 45/1625; H10B 63/24; H10N 70/026; H10N 70/231; H10N 70/8828; H10N 70/841
See application file for complete search history.

(56) References Cited

U.S. PATENT DOCUMENTS

| 9,613,689 | B1* | 4/2017 | Takaki ............... G11C 13/0069 |
| 2004/0178404 | A1* | 9/2004 | Ovshinsky ............ G11C 11/56 257/4 |
| 2007/0034849 | A1 | 2/2007 | Sandoval et al. |
| 2007/0034851 | A1* | 2/2007 | Kostylev ............... H01L 45/144 257/4 |
| 2008/0042167 | A1* | 2/2008 | Chen ................... H01L 45/1233 257/202 |

(Continued)

OTHER PUBLICATIONS

Williams and Carter. "Transmission Electron Microscopy: A Textbook for Materials Science" (Springer 2009). Chapter 1, Section 1.3.B. (Year: 2009).*

(Continued)

*Primary Examiner* — Herve-Louis Y Assouman
*Assistant Examiner* — Christopher M Roland
(74) *Attorney, Agent, or Firm* — Pillsbury Winthrop Shaw Pittman LLP

(57) ABSTRACT

A phase change resistive memory includes an upper electrode; a lower electrode; a layer made of an active material, called an active layer; the memory passing from a highly resistive state to a weakly resistive state by application of a voltage or a current between the upper electrode and the lower electrode and wherein the material of the active layer is a ternary composed of germanium Ge, tellurium Te and antimony Sb, the ternary including between 60 and 66% of antimony Sb.

3 Claims, 4 Drawing Sheets

(56) References Cited

U.S. PATENT DOCUMENTS

| | | | |
|---|---|---|---|
| 2008/0144347 A1* | 6/2008 | Takemura | H01L 27/2436 365/63 |
| 2008/0273372 A1* | 11/2008 | Sandoval | H01L 45/1625 365/148 |
| 2009/0184307 A1* | 7/2009 | Yoon | H01L 45/06 257/3 |
| 2009/0286037 A1 | 11/2009 | Tsuchino et al. | |
| 2010/0012915 A1* | 1/2010 | Yoon | H01L 45/1625 257/3 |

OTHER PUBLICATIONS

Search Report as issued in French Patent Application No. 1900749, dated Nov. 14, 2019.

Wu, Z., et al., "Controlled recrystallization for low current reset programming characteristics of phase-change memory with (Ge-doped SbTe," Applied Physics Letters, vol. 99, No. 14, Oct. 2011, XP012153225, 3 pages.

Cheong, B.-K., et al., "Characteristics of Phase Change Memory Devices based on Ge-doped SbTe and its derivative,"European Phase Change and Ovonic Symposium, E*PCOS 2007, XP055642131, 8 pages.

* cited by examiner

[Fig 1A]
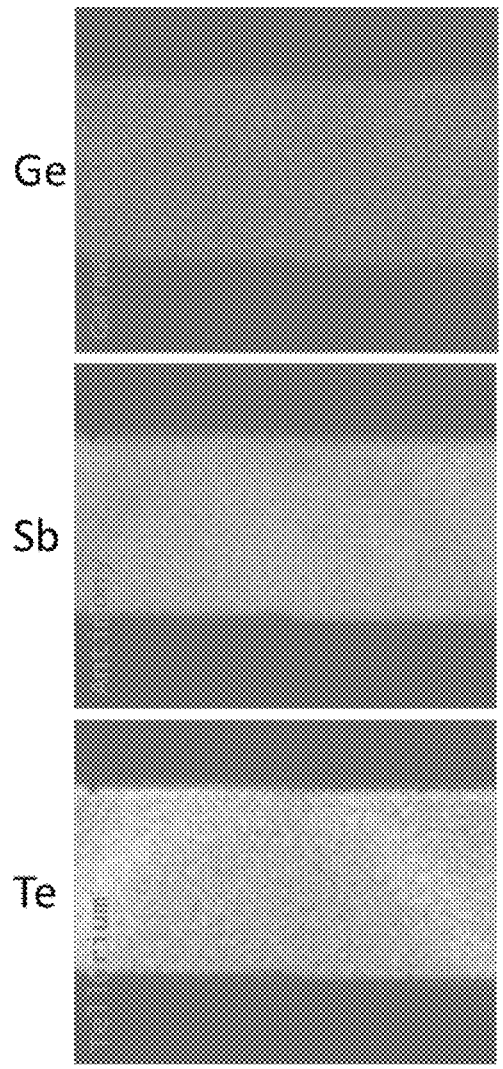
PRIOR ART

[Fig 1B]
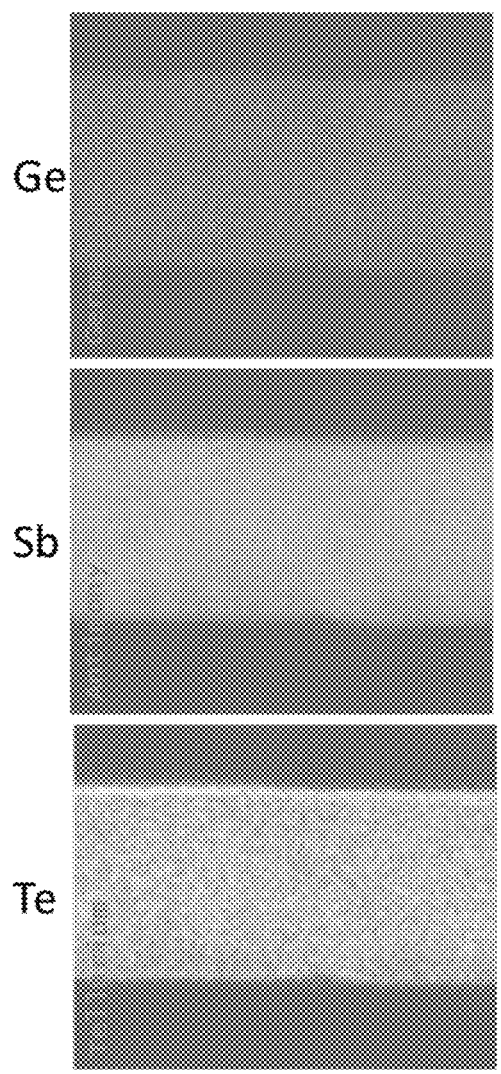

[Fig 2]
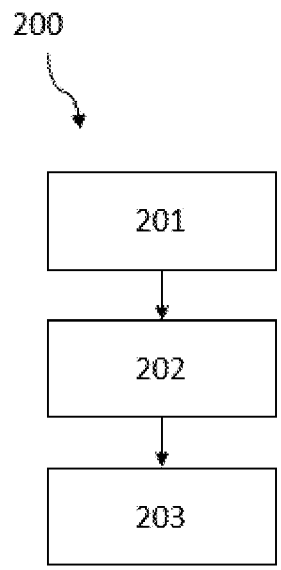
[Fig 3A]
[Fig 3B]
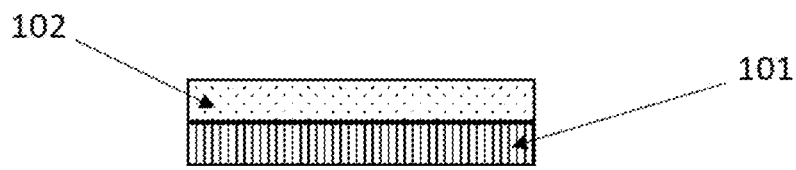

[Fig 3C]
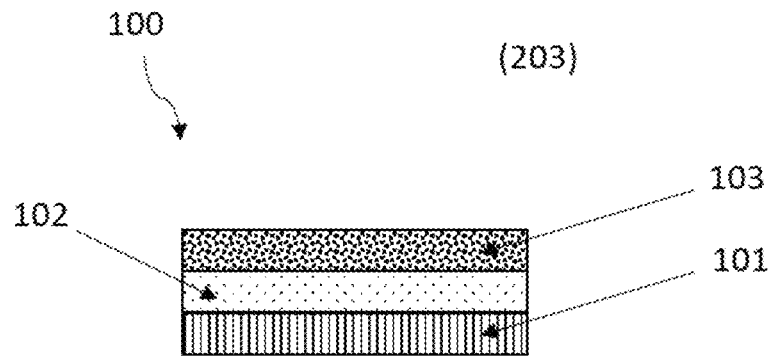
[Fig 4]
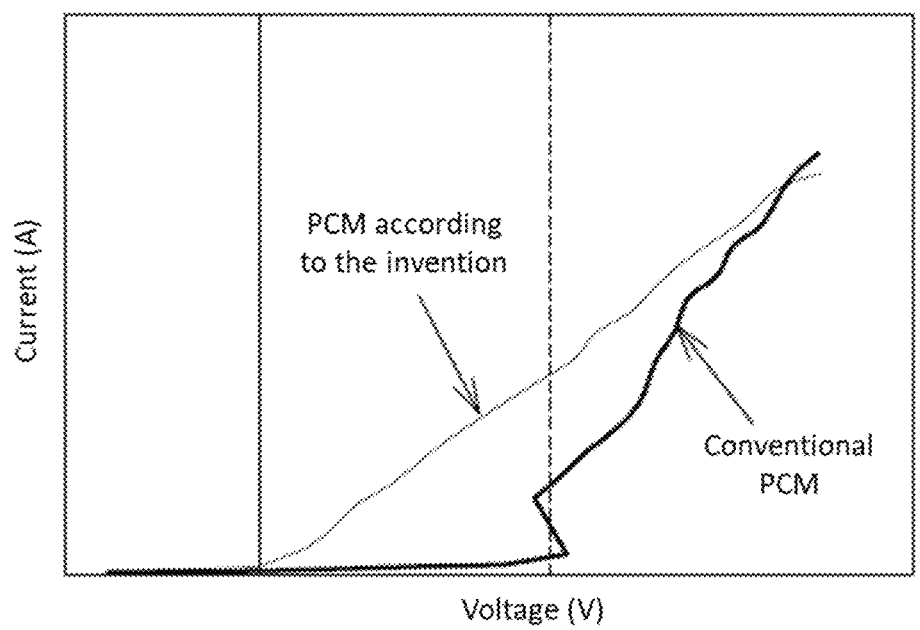
[Fig 5]
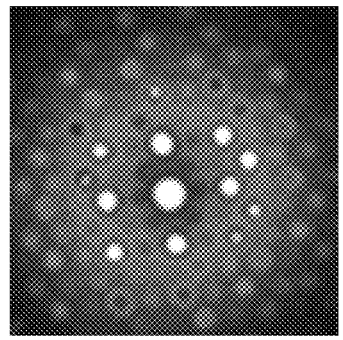

PHASE-CHANGE RESISTIVE MEMORY

CROSS-REFERENCE TO RELATED APPLICATIONS

This application claims priority to French Patent Application No. 1900749, filed Jan. 28, 2019, the entire content of which is incorporated herein by reference in its entirety.

TECHNICAL FIELD OF THE INVENTION

The technical field of the invention is that of phase-change resistive memories.

The present invention relates to a phase-change resistive memory and in particular a phase-change resistive memory the active material of which is a ternary composed of germanium Ge, tellurium Te and antimony Sb. The present invention also relates to a manufacturing method enabling such a resistive memory to be obtained.

TECHNOLOGICAL BACKGROUND OF THE INVENTION

By virtue of their capacity to increase the performance of computers while reducing the consumption thereof, SCM ("Storage Class Memory") type memories characterised by a low programming time, lower than 10 ns and a large endurance, of more than $10^9$ cycles, are rapidly growing.

Within this context, resistive memories are very good candidates to support the development of SCM memories and among them, the phase-change memories (PCM) seem to be the readiest resistive memory technology.

Resistive memories have at least two states corresponding to switching from a high resistivity state to a low resistivity state (SET) or vice versa (RESET).

Conventional PCM memories include two electrodes and a chalcogenide material-based active layer. The operation of conventional PCM memories is based on the phase transition of the chalcogenide material, induced by heating this material under the effect of specific electric pulses generated by its two electrodes. This transition is made between an ordered crystalline phase, having a low resistance and being thermodynamically stable and a disordered amorphous phase, having a high resistance and being thermodynamically instable.

The operation of a conventional PCM memory is illustrated in part of FIG. 4.

In part of [FIG. 4], there is shown the current intensity flowing in the active layer of a conventional PCM memory, initially in its high resistivity state, as a function of the voltage applied across its electrodes.

It is noticed that, for voltages lower than a voltage represented in dotted lines, the current intensity flowing in the active layer of the conventional PCM memory hardly varies as the voltage across the electrodes increases. Indeed, the PCM memory being in its amorphous state, it has a low conductivity.

At the voltage represented in dotted lines called threshold voltage, the active material is brought to its melting temperature. Melting the active material in its amorphous state is necessary to perform thereafter a recrystallisation for achieving the crystalline low resistivity state. A state change between a low conductivity solid state and a high conductivity state, called switching, thus occurs, which is characterised in the curve by abrupt changes of variations at the threshold voltage.

Beyond this threshold voltage, the active material in liquid state is more conducting, which explains the significant intensity increase as a function of the voltage.

To achieve a performance in terms of programming time and endurance demanded by SCM memories, different active materials have been suggested in literature and in particular $Ge_2Sb_2Te_5$ enriched with antimony Sb by a percentage between 10 and 40%, adding antimony Sb resulting in increasing the crystallisation rate.

However, such active materials are prone to a segregation phenomenon causing the active material to lose stability under the effect of crystallisation.

This segregation phenomenon is illustrated in FIG. 1A.

[FIG. 1A] shows three images obtained by transmission electron microscopy representing respectively the concentration of germanium Ge, antimony Sb and tellurium Te of the active layer of a conventional PCM memory made of such an active material, after a programming cycle. The higher the current intensity at a point of the image, the higher the concentration of the component at this point.

For each component of FIG. 1A, a half-ring corresponding to an enriched or depleted zone is visible. For example, it is noticed that, in this zone, the concentration of antimony Sb is lower than the concentration in the rest of the active layer whereas the concentration of tellurium Te is higher than the concentration in the rest of the active layer.

This phenomenon is explained by the search for stability of the components, which, when subjected to an electric pulse, increase their temperature and thus energy, which enables them to migrate to create chemical bonds ensuring a more energetically stable state thereto. Thus, in the course of the programming cycles, the segregation phenomenon intensifies to cause a stability loss of the active material.

There is thus a need for developing a stable PCM memory under the effect of an electric pulse and likely to meet specifications of SCM memories.

SUMMARY OF THE INVENTION

The invention provides a solution to the previously discussed problems, by providing a stable PCM memory with a low programming time and a large endurance.

A first aspect of the invention relates to a phase-change resistive memory including:
an upper electrode;
a lower electrode;
a layer made of an active material, called an active layer;
the memory switching from a high resistivity state to a low resistivity state by applying a voltage between the upper electrode and the lower electrode and being characterised in that the material of the active layer is a ternary composed of germanium Ge, tellurium Te and antimony Sb, the ternary including between 60 and 66% of antimony Sb.

By means of the invention, the provided PCM memory is not subjected to the segregation phenomenon: it is thus stable and meets endurance requirements. Moreover, in the high resistivity state, the material of its active layer is not in an amorphous state but in a polycrystalline state including crystal nuclei. Hence, to switch from a resistive state to the other and thus program the PCM memory, it is sufficient to grow/decrease crystals by applying a given voltage lower than the threshold voltage which is necessary to switch from an amorphous state to a crystalline state in a conventional PCM memory. Therefore, this enables the programming time, the electric stress and thermal stress to be decreased, because there is no switching between a fully amorphous state and a crystalline state, as well as the mechanical stress to be decreased, because there is less density and volume change, and prevents the drift over time from the high resistivity state to higher resistivity states.

Beside the characteristics just discussed in the previous paragraph, the memory according to a first aspect of the invention can have one or more of the complementary characteristics from the following ones, considered individually or according to any technically possible combinations.

According to an exemplary embodiment, the ternary includes between 7 and 13% of germanium Ge and between 27 and 33% of tellurium Te.

According to an exemplary embodiment compatible with the previous exemplary embodiment, the ternary includes 10% of germanium Ge, 27% of tellurium Te and 63% of antimony Sb.

According to one embodiment compatible with the previous exemplary embodiments, the active layer is doped.

A second aspect of the invention relates to a method for manufacturing the memory according to a first aspect of the invention including the steps performed in the following order:
- a step of conformably depositing a conducting material layer of lower electrode onto a substrate;
- a step of sputtering using at least one sputtering target to form the active layer;
- a step of conformably depositing a conducting material layer of upper electrode.

According to a first embodiment, the sputtering step uses a single sputtering target composed of the active material.

According to a second embodiment not compatible with the first embodiment, the sputtering step uses three sputtering targets: a target composed of germanium Ge, a target composed of tellurium Te and a target composed of antimony Sb.

According to a third embodiment, the sputtering step uses two sputtering targets: a target composed of the element of the chemical formula $Ge_2Sb_2Te_5$ and a target composed of antimony Sb.

The target composed of the element of the chemical formula $Ge_2Sb_2Te_5$ being stable, its use prevents formation of aggregates. Moreover, this target being available off the shelf, its cost is lower.

The invention and its different applications will be better understood upon reading the description that follows and upon examining the accompanying figures.

BRIEF DESCRIPTION OF THE FIGURES

The figures are shown for indicative and in no way limiting purposes of the invention.

FIG. 1A shows three images obtained by transmission electron microscopy representing respectively the concentration of germanium Ge, antimony Sb and tellurium Te of the active layer of a PCM memory having a composition according to prior art, after one programming cycle.

FIG. 1B shows three images obtained by transmission electron microscopy representing respectively the concentration of germanium Ge, antimony Sb and tellurium Te of the active layer of a PCM memory according to a first aspect of the invention, after one programming cycle.

FIG. 2 shows the block diagram of a manufacturing method according to a second aspect of the invention.

FIG. 3A shows the schematic representation of a first step of the method according to a second aspect of the invention.

FIG. 3B shows the schematic representation of a second step of the method according to a second aspect of the invention.

FIG. 3C shows the schematic representation of a third step of the method according to a second aspect of the invention.

FIG. 4 represents the current intensity flowing in the active layer of a memory according to a first aspect of the invention and in the active layer of a conventional PCM memory, as a function of the voltage applied across their electrodes, the memories being initially in their high resistivity state.

FIG. 5 shows an image obtained by nano beam diffraction analysis on the material of the active layer of a memory according to a first aspect of the invention.

DETAILED DESCRIPTION OF AT LEAST ONE EMBODIMENT OF THE INVENTION

Unless otherwise indicated, a same element appearing in different figures has a single reference.

FIG. 1A has already been described in reference to the state of the art.

A first aspect of the invention relates to a phase-change resistive memory (PCM memory).

[FIG. 3C] shows a schematic representation of the PCM memory 100 according to a first aspect of the invention.

The PCM memory 100 includes:
- a lower electrode 101;
- an active layer 102; and
- an upper electrode 103.

An upper electrode of a device is defined as the electrode located above this device and the lower electrode of a device as the electrode located below this device, the electrodes being located on either side of the device. Of course, the adjective "upper" and "lower" are herein relating to the orientation of the assembly including upper electrode, device and lower electrode such that by turning over this assembly, the electrode previously referred to as the upper electrode becomes the lower electrode and the electrode previously referred to as the lower electrode becomes the upper electrode.

The lower 101 and upper 103 electrodes are each made of a conducting material which can be different or the same for both electrodes 101, 103. Such a conducting material is for example TiN, TaN, W, TiWN, TiSiN or even WN.

The active layer 102 is an active material layer made of a ternary composed of germanium Ge, tellurium Te and antimony Sb. The percentage of antimony Sb contained in the active material is between 60 and 66%, that is the active material consists of 60 to 66% of antimony Sb and 34 to 40% of germanium Ge and tellurium Te.

For example, the 34 to 40% of germanium Ge and tellurium Te are distributed into 7 to 13% germanium Ge and 27 to 33% tellurium Te.

According to a preferred exemplary embodiment, the active material is composed of 10% of germanium Ge, 27% of tellurium Te and 63% of antimony Sb.

According to one embodiment, the active layer 102 is doped. The active layer 102 is for example doped with carbon C or nitrogen N.

[FIG. 1B] shows three images obtained by transmission electron microscopy representing respectively the concentration of germanium Ge, antimony Sb and tellurium Te of the active layer of the PCM memory 100 after one programming cycle. The higher the current intensity at a point of the image, the higher the concentration of the component at this point.

The absence of the half-ring for the three components and thus the absence of the segregation phenomenon are noticed.

This is very surprising given that in the state of the art, the segregation phenomenon intensifies as antimony Sb is added in the composition of the active material.

In addition to the absence of the segregation phenomenon, the composition of the active layer 102 of the PCM memory 100 is characterised by a polycrystalline phase and not by an amorphous phase in the high resistivity state, and by a single crystal phase in the low resistivity state. More particularly, in the high resistivity state, the active layer 102 has crystal nuclei visible in FIG. 5.

[FIG. 5] is an image obtained by nano beam diffraction analysis on the active layer material of the PCM memory 100 showing crystal nuclei represented by light white dots on the image.

Thus, switching from the low resistivity state to the high resistivity state is not characterised by a state, density, and volume change requiring applying a threshold voltage but by a growth/decrease of crystals requiring applying a voltage lower than the threshold voltage.

FIG. 4 represents the current intensity flowing in the active layer of the PCM memory 100 as a function of the voltage applied across its electrodes in addition to the current intensity flowing in the active layer of a conventional PCM memory as described with reference to the state of the art.

It is noticed that the current intensity linearly increases with the voltage across the electrodes as soon as a voltage represented by a solid line, and being lower than the threshold voltage represented as a dotted line is exceeded.

The composition of the active layer 102 of the PCM memory 100 thus enables the electric stress and thermal stress due to switching from a fully amorphous state to a crystalline state to be decreased and the mechanical stress to be decreased because there is less density and volume modification and having crystal nuclei rather than an amorphous phase in the high resistivity state prevents the drift over time to higher resistivity states.

A second aspect of the invention relates to a method for manufacturing the resistive memory 100.

[FIG. 2] shows a block diagram of steps 201 to 203 of the method 200 for manufacturing the resistive memory 100.

[FIG. 3A] illustrates a first step 201 of the method 200 for manufacturing the resistive memory 100.

The first step 201 consists in performing a conformable deposit of a conducting material layer of lower electrode 101 onto a substrate not represented in FIG. 3A.

By "conformable deposit of a material layer onto a substrate", it is meant that the material is evenly deposited on the whole surface of the substrate.

The substrate can consist of one or more layers: it comprises, for example, a layer with exposed copper lines enabling metal contacts to be made with an upper metal layer and thus comprises the entire logic necessary for allowing connection with the lines of the upper layers.

[FIG. 3B] illustrates a second step 202 of the method 200 for manufacturing the resistive memory 100.

The second step 202 consists in using the sputtering technique to form the active layer 102 of the resistive memory 100.

The sputtering principle is to use the energy of a plasma at the surface of one or more sputtering targets, to withdraw the atoms of the material of the target(s) one by one and to deposit them onto a substrate.

According to a first embodiment, the sputtering step 202 uses a single sputtering target composed of a material having the same composition as the active material of the PCM memory 100 desired to be manufactured. The sputtering step 202 then consists in sputtering the single target.

According to a second embodiment, the sputtering step 202 uses three sputtering targets: a target composed of germanium Ge, a target composed of tellurium Te and a target composed of antimony Sb. The sputtering step 202 then consists in co-sputtering the three targets so as to obtain the desired percentages for each component of the ternary.

According to a third embodiment, the sputtering step 202 uses two sputtering targets: a target composed of the element of the chemical formula $Ge_2Sb_2Te_5$ and a target composed of antimony Sb. The sputtering step 202 then consists in co-sputtering both targets to obtain the desired percentages for each component of the ternary.

It is also possible to use other sputtering targets made of other materials, the previous examples being not limiting. For example, three sputtering targets can be used: a target composed of the element of the chemical formula GeTe, a target composed of the element of the chemical formula $Sb_2Te_3$ and a target composed of antimony Sb. Two sputtering targets can for example be used: a target composed of the element of the chemical formula $Ge_2Te_5$ and a target composed of antimony Sb.

Sputtering or co-sputtering is for example directly made on the conducting material layer of lower electrode 101, as represented in FIG. 3B.

FIG. 3C illustrates a third step 203 of the method 200 for manufacturing the resistive memory 100.

The third step 203 consists in performing a conformable deposit of a conducting material layer of upper electrode 103.

The conformable deposit is for example directly made onto the active layer 102, as represented in FIG. 3C.

The manufacturing method 200 illustrated in FIGS. 3A, 3B and 3C enables a planar-shaped PCM memory 100 to be manufactured but the PCM memory 100 could have a different shape. For example, the conducting material layer of lower electrode 101 includes two branches arranged so as to form an "L" shape, the active layer 102 being in contact with the end of the branch with the greater length. The method for manufacturing such a PCM memory 100 is thereby different from the manufacturing method 200.

The manufacturing method 200 illustrated in FIGS. 3A, 3B and 3C enables only the PCM memory 100 to be manufactured but it could also be manufactured to be co-integrated, for example with a selector device.

The invention claimed is:

1. A method for manufacturing a phase-change resistive memory including
   an upper electrode;
   a lower electrode;
   an active layer made of an active material;
   the memory switching from a high resistivity state to a low resistivity state by applying a voltage between the upper electrode and the lower electrode, the material of the active layer being a ternary composed of germanium Ge, tellurium Te and antimony Sb, the ternary including 10% of germanium Ge, 27% of tellurium Te and 63% of antimony Sb, the material of the active layer being in a polycrystalline phase in the high resistivity state and in a crystalline phase in the low resistivity state, the method comprising the steps performed in the following order:
   a step of conformably depositing a conducting material layer of the lower electrode onto a substrate;

a step of sputtering using two sputtering targets to form the active layer, a target composed of the element of the chemical formula $Ge_2Sb_2Te_5$ and a target composed of antimony Sb, and a step of conformably depositing a conducting material layer of the upper electrode, wherein the switching from the high resistivity state to the low resistivity state in said memory is obtained by growth of crystals of the polycrystalline phase.

2. The method according to claim 1, wherein the active layer is doped.

3. The method according to claim 1, wherein a current intensity flowing in the active layer of the memory increases linearly as soon as the voltage between the upper electrode and the lower electrode exceeds a first voltage, said first voltage being lower than a threshold voltage for which the material of the active layer switches from an amorphous state to a crystalline state.

* * * * *